United States Patent
Chen et al.

(10) Patent No.: US 10,682,817 B2
(45) Date of Patent: Jun. 16, 2020

(54) METHOD AND SYSTEM FOR PRINTING 3D OBJECT

(71) Applicant: Zhuhai Seine Technology CO., Ltd., Zhuhai (CN)

(72) Inventors: Xiaokun Chen, Zhuhai (CN); Wei Jiang, Zhuhai (CN); Wei Chen, Zhuhai (CN); Yi Zhou, Zhuhai (CN)

(73) Assignee: ZHUHAI SEINE TECHNOLOGY CO., LTD., Zhuhai (CN)

(*) Notice: Subject to any disclaimer, the term of this patent is extended or adjusted under 35 U.S.C. 154(b) by 188 days.

(21) Appl. No.: 15/882,690

(22) Filed: Jan. 29, 2018

(65) Prior Publication Data

US 2018/0162057 A1  Jun. 14, 2018

Related U.S. Application Data

(63) Continuation of application No. PCT/CN2016/091685, filed on Jul. 26, 2016.

(30) Foreign Application Priority Data

Aug. 10, 2015 (CN) .......................... 2015 1 0487547

(51) Int. Cl.
*H04N 1/60* (2006.01)
*B29C 64/393* (2017.01)
(Continued)

(52) U.S. Cl.
CPC .......... *B29C 64/393* (2017.08); *B29C 64/112* (2017.08); *B29C 64/124* (2017.08);
(Continued)

(58) Field of Classification Search
None
See application file for complete search history.

(56) References Cited

U.S. PATENT DOCUMENTS

2011/0285054 A1  11/2011  Eliahu
2012/0065755 A1   3/2012  Steingart et al.
(Continued)

FOREIGN PATENT DOCUMENTS

CN  1270883 A  10/2000
CN  102729476 A  10/2012
(Continued)

OTHER PUBLICATIONS

The European Patent Office (EPO) The Extended European Search Report for 16834561.9 dated Jun. 7, 2018 8 Pages.

*Primary Examiner* — Dung D Tran
(74) *Attorney, Agent, or Firm* — Anova Law Group, PLLC

(57) ABSTRACT

The present invention provides a method and system for printing a 3D object. The method for printing a 3D object includes the following steps: a. performing conversion based on layered image data $D_M$ of a target object to obtain printing data $P_{MN}$, where $D_M$ consists of a value set $X_{MN}$ of $N_M$ pixel points, M represents the number of layers of a layered image, and N represents the number of pixel points; b. performing layer-by-layer printing based on the printing data $P_{MN}$, where when $P_{MN}$ is 0, a first printing material is used for printing, and when the printing data $P_{MN}$ is 1, a second printing material is used for printing; and c. superposing results of the layer-by-layer printing in step b to form a 3D object.

21 Claims, 5 Drawing Sheets

(51) Int. Cl.
*B33Y 10/00* (2015.01)
*B33Y 50/02* (2015.01)
*H04N 1/405* (2006.01)
*B29C 64/112* (2017.01)
*G06F 30/00* (2020.01)
*B29C 64/124* (2017.01)
*B41F 15/08* (2006.01)
*B33Y 50/00* (2015.01)

(52) U.S. Cl.
CPC ............... *B33Y 10/00* (2014.12); *B33Y 50/02* (2014.12); *B41F 15/0881* (2013.01); *G06F 30/00* (2020.01); *H04N 1/405* (2013.01); *B33Y 50/00* (2014.12)

(56) References Cited

U.S. PATENT DOCUMENTS

| | | | |
|---|---|---|---|
| 2014/0052285 A1* | 2/2014 | Butcher | G05B 19/0426 700/98 |
| 2014/0063558 A1* | 3/2014 | Holroyd | B29C 65/002 358/3.22 |
| 2014/0324204 A1 | 10/2014 | Vidimce et al. | |
| 2016/0257071 A1* | 9/2016 | Okamoto | B29C 64/165 |
| 2016/0318256 A1* | 11/2016 | Alkhatib | G06T 17/00 |
| 2018/0117849 A1* | 5/2018 | Brunton | B33Y 10/00 |
| 2018/0229447 A1* | 8/2018 | Mantell | B29C 64/386 |

FOREIGN PATENT DOCUMENTS

| | | | |
|---|---|---|---|
| EP | 1894704 A1 | 3/2008 | |
| JP | 2015136795 A | 7/2015 | |
| WO | 2012085914 A1 | 6/2012 | |

* cited by examiner

METHOD AND SYSTEM FOR PRINTING 3D OBJECT

CROSS-REFERENCES TO RELATED APPLICATIONS

The present invention is a continuation application of PCT Patent Application No. PCT/CN2016/091685, filed on Jul. 26, 2016, which claims priority to Chinese Patent Application No. 201510487547.3, filed on Aug. 10, 2015, entire content of all of which is incorporated by reference.

BACKGROUND

Technical Field

The present invention relates to a rapid prototyping technology of a 3D object, in particular, to a technology in which an inkjet printhead is used to perform layer-by-layer additive manufacturing of a 3D object, and specially, to a method and system for printing a 3D object.

Related Art

A rapid prototyping technology is also referred to as a rapid prototype manufacturing technology. Under control of a computer and based on the discrete/stacking principle, a physical shape of an object is converted into a three-dimensional digital model by using modeling software or a three-dimensional scanner, and the model is used to generate an STL file. Lamination software is used to discrete the model on Z-axis, to form a series of thin sheets having a same thickness or having different thicknesses, then a fused deposition modeling technology (FDM technology), a stereo lithography appearance technology (SLA technology), a selective laser sintering technology (SLS technology), a laminated object manufacturing technology (LOM technology), or the like is utilized to process and stack the series of thin sheets layer by layer, and finally, post-processing is performed to obtain a 3D image.

Compared with the conventional SLA, SLS, and LOM technologies, for a multi jet printing technology (MJP technology), according to the operating principle of an ink-jet printer, liquid (a building material and/or a manufacturing material) in a nozzle chamber instantly forms droplets under excitation of a digital signal, and the droplets are ejected from the nozzle at a speed and frequency. The droplets are cured and formed layer by layer according to a specified path, so that a 3D image is finally obtained. Because an expensive laser system is not required when the MJP is used, a device is cheap, and operation and maintenance costs are also very low. Compared with the FDM technology, work can be performed at a lower temperature when the MJP technology is used. Moreover, the MJP technology has such advantages as simple operation, high forming speed, high applicability to multiple materials, high precision of a formed member, and capability of being used in an office environment. Therefore, the MJP technology is one of current research focuses of the rapid prototyping technology.

Objects that are manufactured by using the MJP technology may be classified into two categories according to surface colors: one category is monochromatic objects, and the other category is colorful objects (including at least two colors). As demands on material culture increase, people are no more satisfied with single visual sense, and they expect to manufacture any colorful object having a personalized design by fully utilizing the advantages of the MJP technology.

An existing method for printing a 3D object on the market is that: different areas of a model file are manually colored, lamination processing is performed on the colored model by using lamination software, data information generated after the lamination processing is sent to a printer driving controller, the driving controller controls a printhead to eject ink along a predetermined path, layer-by-layer superposition is performed after curing, and finally a colorful object is printed out.

A disadvantage in the prior art is that the technology still remains stuck at a technical level of color selection for a module. In this case, it needs to be manually determined to add a color to a module. Such manual selection consumes time and labor power, and expression of color transition is poor. Moreover, different people have different abilities to discriminate between colors, and consequently, there may be color difference between a printed object and an object that is actually needed.

SUMMARY

For the disadvantage in the prior art, according to one aspect of the present invention, a method for printing a 3D object is provided, including the following steps:

a. performing conversion based on layered image data $D_M$ of a target object to obtain printing data $P_{MN}$, wherein $D_M$ consists of a value set $X_{MN}$ of $N_M$ pixel points, M represents the number of layers of a layered image, and N represents the number of pixel points;

b. performing layer-by-layer printing based on the printing data $P_{MN}$, wherein when the printing data $P_{MN}$ is 0, a first printing material is used for printing; and c. superposing results of the layer-by-layer printing in step b to form a 3D object.

Further, in step b, when the printing data $P_{MN}$ is 0, correction is performed on the printing data $P_{MN}$ to obtain corrected printing data $P_{MN}'$, and when the corrected printing data $P_{MN}'$ is identified, the first printing material is used for printing.

Further, in step b, an association is established between the corrected printing data $P_{MN}'$ and a printing startup instruction, and when the corrected printing data $P_{MN}'$ is identified, the first printing material is used for printing.

Further, lamination and unit-division processing is performed on the entire target object to obtain the layered image data $D_M$.

Further, in step a, half-tone conversion is performed on the layered image data $D_M$ to obtain the printing data $P_{MN}$.

Further, the layered image data $D_M$ is 8-bit data, and values of $X_{MN}$ corresponding to $D_M$ are between 0 and 255.

Further, the printing data $P_{MN}$ is obtained in the following manner:

a1. dividing the value set $X_{MN}$ by 255 to obtain a corresponding fitted value set $X_{MN}'$, where the fitted value set $X_{MN}'$ is between 0 and 1, and the fitted value set $X_{MN}'$ consists of $x_{11}'$, $x_{12}'$, $x_{21}'$, $x_{22}'$, ..., and $x_{MN}'$; and a2. setting a threshold S, and comparing the fitted value set $X_{MN}'$ with the threshold S, where if $x_{MN}'$ is less than S, converted $p_{MN}$ is 0; or if $x_{MN}'$ is greater than S, converted $p_{MN}$ is 1, and the printing data $P_{MN}$ that is correspondingly formed consists of a series of $p_{MN}$.

Further, the printing data $P_{MN}$ is obtained in the following manner:

a1'. dividing the value set $X_{MN}$ by 255 to obtain a corresponding fitted value set $X_{MN}'$, where the fitted value set $X_{MN}'$ sequentially consists of $x_{M1}'$, $x_{M2}'$, $x_{M3}'$, ..., and $x_{MN}'$ according to an order of neighboring relationships of N pixel points of an $M^{th}$-layer image;

a2'. comparing a threshold S with $x_{M1}'$, where if $x_{M1}'$ is less than S, $p_{M1}$ is 0; or if $x_{11}'$ is greater than S, $p_{M1}$ is 1;

a3'. calculating a difference $E_{MN}$ by subtracting $p_{MN}$ from $x_{MN}'$, and calculating a sum of $x_{M(N+1)}'$ and $E_{MN}$ to obtain $x_{M(N+1)}''$;

a4'. comparing $x_{M(N+1)}''$ with the threshold S, where if $x_{M(N+1)}''$ is less than S, $p_{M(N+1)}$ is 0; or if $x_{M(N+1)}''$ is greater than S, $p_{M(N+1)}$ is 1; and a5'. repeating steps a3' and a4' until all $x_{MN}$ are converted into $p_{MN}$, where the printing data $P_{MN}$ that is correspondingly formed consists of a series of $p_{MN}$.

Further, S is any one of the following values: 0.4; 0.5; 0.55; 0.6; or 0.65.

Further, the printing data $P_{MN}$ is obtained in the following manner:

a1''. dividing the value set $X_{MN}$ by 255 to obtain a corresponding fitted value set $X_{MN}'$, and sorting the fitted value set $X_{MN}'$ according to N pixel points of an $M^{th}$-layer image, where the fitted value set $X_{MN}'$ sequentially consists of $x_{M1}'$, $x_{M2}'$, $x_{M3}'$, $x_{M4}'$, ..., and $x_{MN}'$;

a2''. setting g thresholds and sorting the g thresholds to form a threshold set $S_{Mg}'$, wherein the threshold set $S_{Mg}'$ sequentially consists of $s_{M1}'$, $s_{M2}'$, $s_{M3}'$, $s_{M4}'$, ..., and $s_{Mg}'$, and $0<g\leq N$; and a3''. based on a sequence of the threshold set $S_{Mg}'$, correspondingly comparing N values of the $M^{th}$-layer image in the fitted value set $X_{MN}'$ with the g thresholds $s_{Mg}'$ in the threshold set $S_{Mg}'$ one by one, where if $x_{MN}'$ is less than $s_{Mg}'$, $p_{MN}$ is 0; or if $x_{MN}'$ is greater than $s_{Mg}'$, $p_{MN}$ is 1, and the printing data $P_{MN}$ that is correspondingly formed consists of a series of $p_{MN}$.

Further, a value range of the threshold set $S_{Mg}'$ is any value between 0.4 and 0.65.

Further, the layered image data $D_M$ is 16-bit data, and values of $X_{MN}$ corresponding to $D_M$ are between 0 and 65535.

Further, the first printing material is one of the following materials:
a transparent material;
a white material; or
an off-white material.

Further, in step b, when $P_{MN}$ is 1, a second printing material is used for printing.

Further, the second printing material is one of the following materials:
a combination of a cyan material, a magenta material, and a yellow material; or
a combination of any two of a cyan material, a magenta material, and a yellow material.

Further, the first printing material and the second printing material are one of the following materials:
a light-curing material; or
a temperature curing material.

Further, in step c, each result of the layer-by-layer printing is cured and then superposed.

Further, in step c, after being leveled, each result of the layer-by-layer printing is first cured and then superposed.

According to another aspect of the present invention, a system for printing a 3D object is provided, including a data processor, a process controller, and a printhead, wherein the data processor converts layered image data $D_M$ of a target object to obtain printing data $P_{MN}$, and performs correction on data being 0 in the printing data $P_{MN}$, to obtain corrected printing data $P_{MN}'$; and the process controller controls, based on the printing data $P_{MN}$ and the corrected printing data $P_{MN}'$, the printhead to perform layer-by-layer printing and superposition, to form a 3D object, wherein based on the corrected printing data $P_{MN}'$, a first printing material is used for printing, and based on the printing data $P_{MN}$, a second printing material is used for printing.

Further, the system further includes a leveling apparatus, where the leveling apparatus is configured to perform leveling on each result of the layer-by-layer printing.

Further, the system further includes a curing apparatus, where the curing apparatus is configured to perform curing on each result of the layer-by-layer printing.

According to the present invention, a layer-by-layer printing method is used. After lamination and unit-division is performed on an entire target object, layered image data $D_M$ is obtained, and half-tone conversion is performed on the layered image data $D_M$ to obtain printing data $P_{MN}$. When $P_{MN}$ is 0, a first printing material is used for printing; or when $P_{MN}$ is 1, a second printing material is used for printing. A 3D object that is printed out by using the printing method of the present invention has stronger sense of layers. Especially when a colorful 3D object is printed, rich colors and natural transition between different colors can also be presented. Meanwhile, a method process of the present invention is simple, the automation degree is high, and a product is easily implemented.

BRIEF DESCRIPTION OF THE DRAWINGS

Other features, objectives, and advantages of the present invention will become more apparent with reference to detailed descriptions of non-limiting embodiments in the accompanying drawings.

DETAILED DESCRIPTION

Figure 1:
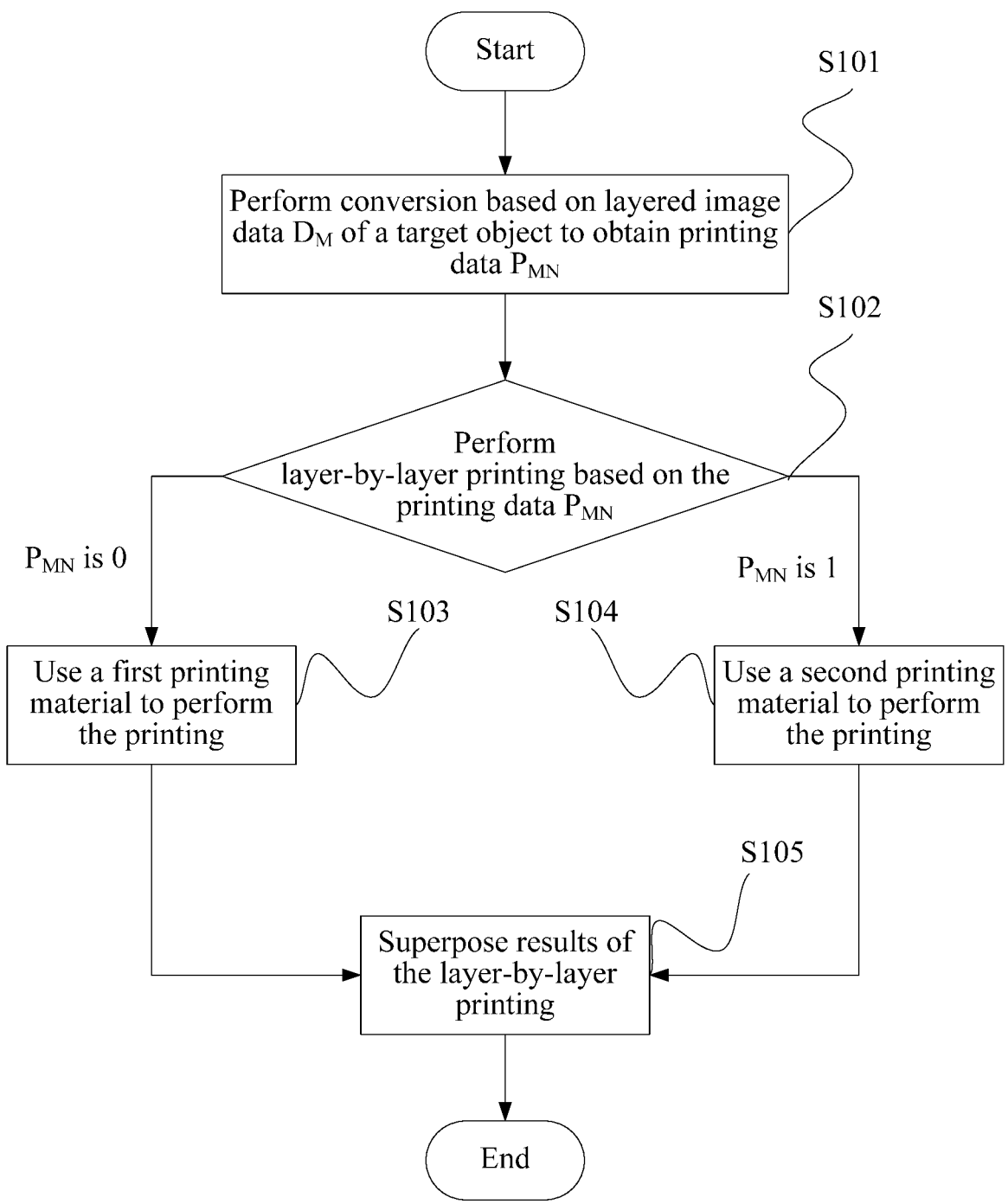
FIG. 1 is a flowchart of a method for printing a 3D object according to a specific implementation of the present invention.

FIG. 1 is a flowchart of a method for printing a 3D object according to a specific implementation of the present invention. Specifically, the method includes the following steps.

Step S101 is performed. Conversion is performed based on layered image data $D_M$ of a target object to obtain printing data $P_{MN}$. $D_M$ consists of a value set $X_{MN}$ of $N_M$ pixel points. A person skilled in the art understands that, $D_M$ consists of image data of M layers, and includes $d_1, d_2, d_3, \ldots$, and $dM$; $N_M$ represents the number of pixel points included in the target object; $X_{MN}$ consists of values of the pixel points, and includes $x_{11}, x_{12}, x_{21}, x_{22}, \ldots$, and $x_{MN}$; and $P_{MN}$ consists of printing data values that are obtained after the conversion is performed on the values of the pixel points, and includes $p_{11}, p_{12}, p_{21}, p_{22}, \ldots$, and $p_{MN}$. Specifically, M represents the number of layers of a layered image, and N represents the number of the pixel points.

Further, the layered image data $D_M$ is data that is obtained after lamination and unit-division processing is performed on the target object. The layered image data $D_M$ corresponds to the value set $X_{MN}$ that consists of the values of the $N_M$ pixel points in the target object. The values of the $N_M$ pixel points include data of two aspects: spatial coordinates of the $N_M$ pixel points on a section on which the $N_M$ pixel points are located, and color values of the $N_M$ pixel points that are defined based on the section. Specifically, the spatial coordinates are obtained by performing lamination on the target object, and are defined by setting one or more coordinate axes in one or more directions. The color values may be color data based on a CMY color mode, or may be color data based on a CMYK color mode, or may be color data based on another color mode. The color values are defined based on a 2D printing technology.

Further, the printing data $P_{MN}$ is obtained after the conversion is performed on the layered image data $D_M$. A person skilled in the art understands that there are many studies on a conversion method in the 2D printing field. According to the theory of image data conversion for 2D printing, in the 2D printing, an objective of performing the image data conversion is to implement obtaining, transmission, reproduction, and the like of an image with loss as little as possible. In a 3D printing technology, if conversion is only performed on specific layered image data, the basic principle of the conversion is similar to that of the 2D printing. However, when the layered image data is converted in the 3D printing, data of the layered image data in the 3D space, that is, information about spatial coordinates, also needs to be considered to better reproduce the target object.

Further, step S102 is performed. Layer-by-layer printing is performed based on the printing data $P_{MN}$. A person skilled in the art understands that, during actual application, drive control data of most printheads is binary, and a corresponding value of the printing data $P_{MN}$ that is obtained after the conversion is performed is 0 or 1. Specifically, in an existing printing process, when the printing data $P_{MN}$ is 0, a printhead does not perform the printing. Only when the printing data $P_{MN}$ is 1, the printhead performs the printing. More specifically, in the present invention, a 3D object needs to be finally implemented. If a printing material is not ejected when the printing data $P_{MN}$ is 0, a pixel point at such position may be finally filled by a printing material of another pixel point, finally affecting a shape of the entire 3D object. Therefore, the printing data $P_{MN}$ that is obtained after the conversion is performed needs to be further processed, so that each pixel point is printed. That is, regardless of whether the printing data $P_{MN}$ is 0 or 1, the printhead is controlled to eject the printing material. More specifically, because drive control data of a common printhead is binary, a printing instruction received by the printhead is actually 0 or 1. The printhead does not perform the printing when the printing instruction is 0, that is, the printhead does not control a printing nozzle to eject the printing material. The printhead performs the printing when the printing instruction is 1, that is, the printhead controls the printing nozzle to eject the printing material. A process of performing further processing on the printing data $P_{MN}$ is to convert the printing data $P_{MN}$ whose value is 0, so that the printhead identifies the printing data $P_{MN}$ whose value is 0 as a printing instruction 1.

Further, based on performing step S102, when the printing data $P_{MN}$ is 0, step S103 is performed, and a first printing material is used for printing. When the printing data $P_{MN}$ is 1, step S104 is performed, and a second printing material is used for printing. That is, according to different values of the printing data $P_{MN}$, the printhead is controlled to eject different printing materials. A specific process thereof is actually a process of converting the printing data $P_{MN}$ into different printing instructions. In an embodiment, the first printing material is a transparent material, a white material, or an off-white material, and the second printing material is a combination of a cyan material, a magenta material, and a yellow material. Specifically, when the second printing material is used for printing, a color that is used for printing needs to be selected according to a primary color of a section on which a pixel point to be printed is located. For example, the primary color of the section on which the pixel point to be printed is located is cyan, and the cyan material is used for printing. More specifically, determining of the primary color of the section is described in the foregoing step, and details are not described herein again. In a variation, the second printing material may alternatively be a combination of any two of a cyan material, a magenta material, and a yellow material, and another color material may also be added. This needs to be determined according to a color mode after half-tone conversion. A person skilled in the art understands that the first printing material and the second printing material may have multiple color combinations. Further, the first printing material and the second printing material are further light-curing materials or temperature curing materials.

In an embodiment, a method for performing further processing on the printing data $P_{MN}$ is to perform correction on the printing data $P_{MN}$, to obtain corrected printing data $P_{MN}'$. Specifically, because drive control data of a common printhead is binary, a printing instruction received by the printhead is actually 0 or 1. A correction process is that, when a value of the printing data $P_{MN}$ is 0, a value of the corrected printing data $P_{MN}'$ that is obtained after the correction is performed is 1, so that the printhead can identify and perform the printing. More specifically, the first printing material is used for printing, provided that the printhead identifies the corrected printing data $P_{MN}'$. In a specific embodiment, for example, the printing data $P_{MN}$ is data based on the CMY color mode, the printing data $P_{MN}$ is transferred to the printhead by using four transmission channels. Three of the four transmission channels are configured to transmit data of the CMY color mode, and the remaining one transmission channel is configured to transmit the corrected printing data $P_{MN}'$. A controller of the printhead separately identifies the printing data $P_{MN}$ and the corrected printing data $P_{MN}'$, and further starts to use the second printing material or the first printing material to perform the printing. In a variation, dedicated data channels are separately disposed for the printing data $P_{MN}$ and the corrected printing data $P_{MN}'$, and a controller data channel matches and interconnects each of $P_{MN}$ and $P_{MN}'$. That is, there are four controllers that respectively correspond to three types of data of the CMY color mode and the corrected printing data $P_{MN}'$. In this case, a process of identifying the printing data $P_{MN}$ and the corrected printing data $P_{MN}'$ may be omitted, and the printing may be started when the printing data $P_{MN}$ and the corrected printing data $P_{MN}'$ are generated.

In a variation, an association is further established between the corrected printing data $P_{MN}'$ and a printing startup instruction, and when the corrected printing data $P_{MN}'$ is identified, the first printing material is used for printing. A person skilled in the art understands that, further, a printing process including multiple printheads is used in this variation. In a specific correction process, not only the correction is performed on the value of the printing data $P_{MN}$, but also an association is established between the corrected printing data $P_{MN}{}'$ that is obtained each time the correction is performed and printing startup instructions of different printheads, to implement multi-printhead printing, and increase the printing speed.

Further, step S105 is performed. Results of the layer-by-layer printing in step S102 are superposed to form a 3D object. A person skilled in the art understands that this step is a forming step. Step S102 to step S104 relate to printing of a specific layer, but the target object has M layers in total. The M layers are all printed layer by layer by performing step S102 to step S104, and the M layers are superposed to form the 3D object. More specifically, the superposition in this step is not a step that is finally performed, but is a step that is performed with step S102 to step S104. That is, one layer is superposed after a printing result of the layer is completed by performing step S102 to step S104. Such superposition process is an accumulative process. Further, each result of the layer-by-layer printing that is formed by performing step S102 to step S104 is first cured and then superposed, to further improve the dimensional stability of the 3D object, and avoid penetration between the results of the layer-by-layer printing. In a variation, after being leveled, each result of the layer-by-layer printing is first cured and then superposed. According to the variation, the dimensional stability of the 3D object can be further improved, and the formed 3D object can have a more aesthetic appearance.

In a first embodiment of the present invention, the layered image data $D_M$ is obtained by performing lamination and unit-division processing on the entire target object. A person skilled in the art understands that, in this embodiment, the lamination and unit-division processing is performed on the entire target object. This can most likely implement perfect reproduction of the target object, and continuity in both a shape and a color of the target object can be better implemented. Specially, when the target object has a perspective effect, the printing is further performed according to this embodiment. A person skilled in the art understands that, a specific process of the lamination and unit-division is divided into two parts. A first part is to perform lamination on the entire target object, to obtain multiple sections and spatial coordinates of the sections. A second part is to perform unit-division processing on each section, determine the number of pixel points of each unit, and determine a color value of each pixel point according to a color of the unit.

Further, for the lamination processing in the first part, a lamination processing algorithm based on grouping and sorting and calculation of an intersection of opposite sides is implemented. The basic idea thereof is that, entire grouping and sorting is performed according to geometrical continuity of an STL model, a lamination relationship matrix is established, then opposite sides of a triangular patch in the relationship matrix are separately tracked to calculate an intersection, and finally section profile data is generated. Specifically, the first part is implemented in the following manner: a first step is to perform grouping and sorting. A person skilled in the art understands that, compared with the size of the triangular patch in the STL model, a lamination thickness of rapid prototyping processing is usually very small, and a triangular patch usually intersects with multiple adjacent laminated planes. Because of the geometrical continuity of the STL model, triangular patches intersecting with a laminated plane are also arranged sequentially. Therefore, except a few of laminated panels, a set of the triangular patches intersecting with adjacent laminated panels is successive. That is, a set of patches intersecting with two adjacent laminated panels is basically unchanged. A second step is to calculate the intersection of the opposite sides, to obtain the section profile data. A specific process is usually that, a series of sides and a group of slice planes that are parallel to each other are known, intersection points between each side and the group of planes are calculated, and all intersection points on a same layer are sequentially arranged according to a connection relationship of the intersection points, forming a closed section profile of each layer. During actual operation, the lamination steps are usually performed by using lamination software. The specific number of layers needs to be determined according to a spatial resolution of a final 3D object. A higher spatial resolution indicates a larger number of layers, and a lower spatial resolution indicates a smaller number of layers.

Further, for the unit-division processing of the second part, the number of pixel points of each unit is first determined. Specifically, the number needs to be determined according to a resolution required by each section. A higher resolution indicates a larger number of pixel points, and a lower resolution indicates a smaller number of pixel points. More specifically, a particular section is divided into multiple units, and each unit is a rectangular pixel point array consisting of pixel points. For example, three primary colors CMY (that is, cyan, magenta, and yellow) are used as an example, the particular section is first divided into planes of the three primary colors, unit-division is performed on a plane of each primary color, and each unit that is formed after the division is a rectangular pixel point array consisting of pixel points of a particular primary color. For another example, four primary colors CMYK (that is, cyan, magenta, yellow, and black) are used as an example, the particular section is first divided into planes of the four primary colors, unit-division is performed on a plane of each primary color, and each unit that is formed after the division is a rectangular pixel point array consisting of pixel points of a particular primary color. Secondly, a color value of each pixel point is determined. This is described in the foregoing specific implementation, and details are not described herein again.

In a second embodiment of the present invention, the printing data $P_{MN}$ in step S102 is obtained by performing half-tone conversion on the layered image data $D_M$. A person skilled in the art understands that, in this embodiment, the half-tone conversion is performed on the color values of the $N_M$ pixel points that are defined based on the section on which the $N_M$ pixel points are located. Specifically, in fact, a process of the half-tone conversion is to convert a value of a particular pixel point into corresponding printing data. More specifically, a person skilled in the art understands that, in the 3D printing, when the half-tone conversion is performed, not only a two-dimensional color resolution of the particular section needs to be considered, but also a spatial color resolution of the entire target object needs to be considered. A reason is that the 3D object is finally formed after multiple sections are superposed, and a color resolution of each section may superpose each other and finally affect the spatial color resolution of the 3D object. Specifically, when the half-tone conversion is performed on each section, color resolution standards of the sections may be consistent, or may be inconsistent. This depends on the spatial color complexity of the 3D object. For example, a color resolution of a section in a central part of the 3D object may be relatively low, and a color resolution of a section that is close to a surface part of the 3D object may be relatively high. For another example, a color resolution of a section that is distant from a transparent part of the 3D object may be relatively low, and a color resolution of a section that is close to the transparent part of the 3D object may be relatively high.

Figure 2:
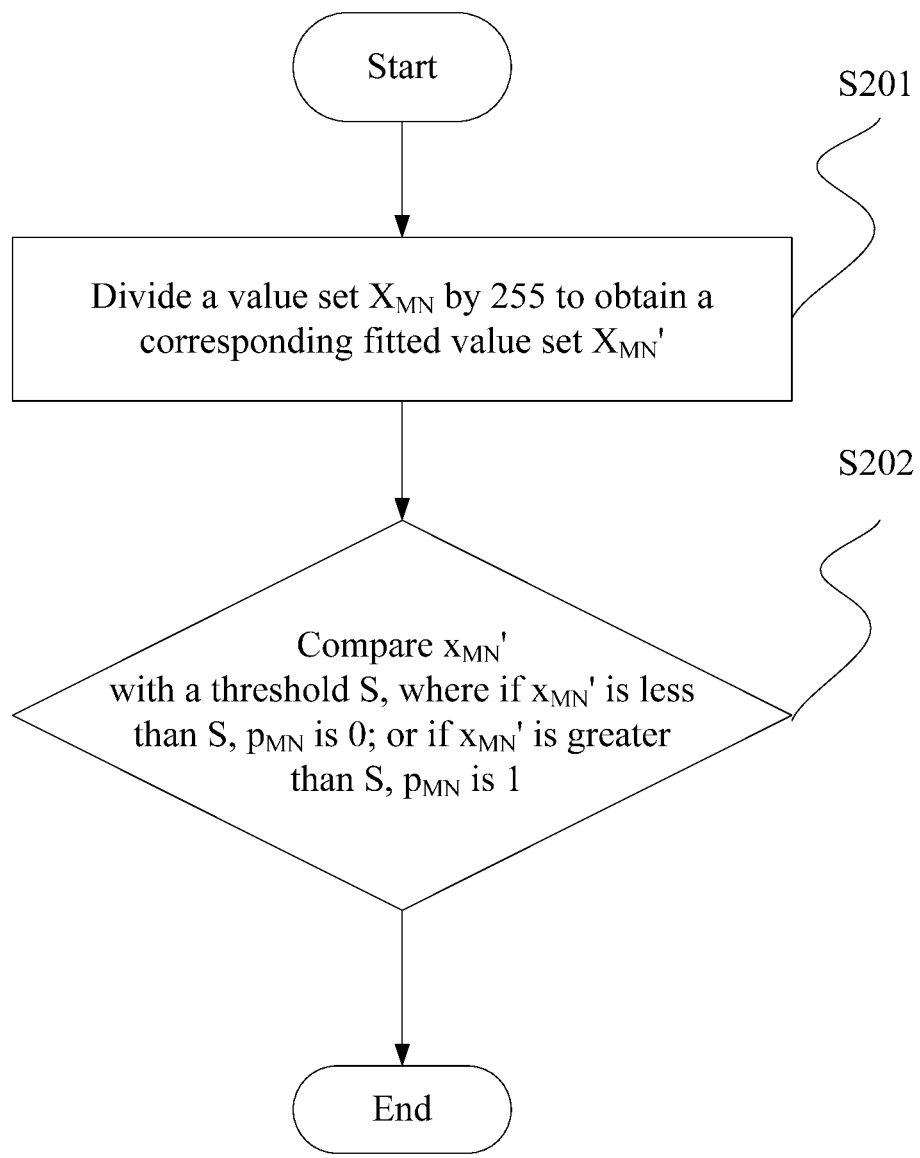
FIG. 2 is a flowchart of a method for obtaining printing data $P_{MN}$ by converting layered image data $D_M$ according to an embodiment of the present invention.

In an embodiment, an example in which the layered image data $D_M$ is 8-bit data is used for description. A person skilled in the art understands that, when the layered image data $D_M$ is 8-bit data, values of $X_{MN}$ corresponding to $D_M$ are between 0 and 255. As shown in FIG. 2, the printing data $P_{MN}$ is obtained in the following manner:

Step S201 is performed. The value set $X_{MN}$ is divided by 255 to obtain a corresponding fitted value set $X_{MN}'$. The fitted value set $X_{MN}'$ is between 0 and 1. Specifically, a person skilled in the art understands that, the value set $X_{MN}$ consists the values of the $N_M$ pixel points, including $x_{11}$, $x_{12}$, $x_{21}$, $x_{22}$, . . . , and $x_{MN}$, and the fitted value set $X_{MN}'$ is formed corresponding to the value set $X_{MN}$. That is, the fitted value set $X_{MN}'$ consists of fitted values of the $N_M$ pixel points, that is, the fitted value set $X_{MN}'$ consists of $x_{11}'$, $x_{12}'$, $x_{21}'$, $x_{22}'$, . . . , and $x_{MN}'$.

Further, step S202 is performed. A threshold S is set. If $x_{MN}'$ is less than S, converted $p_{MN}$ is 0; or if $x_{MN}'$ is greater than S, converted $p_{MN}$ is 1, and the printing data $P_{MN}$ that is correspondingly formed consists of a series of $p_{MN}$. Further, the threshold S is a value between 0.4 and 0.65. Specifically, the value of S is 0.4, 0.5, 0.55, 0.6, or 0.65.

Figure 3:
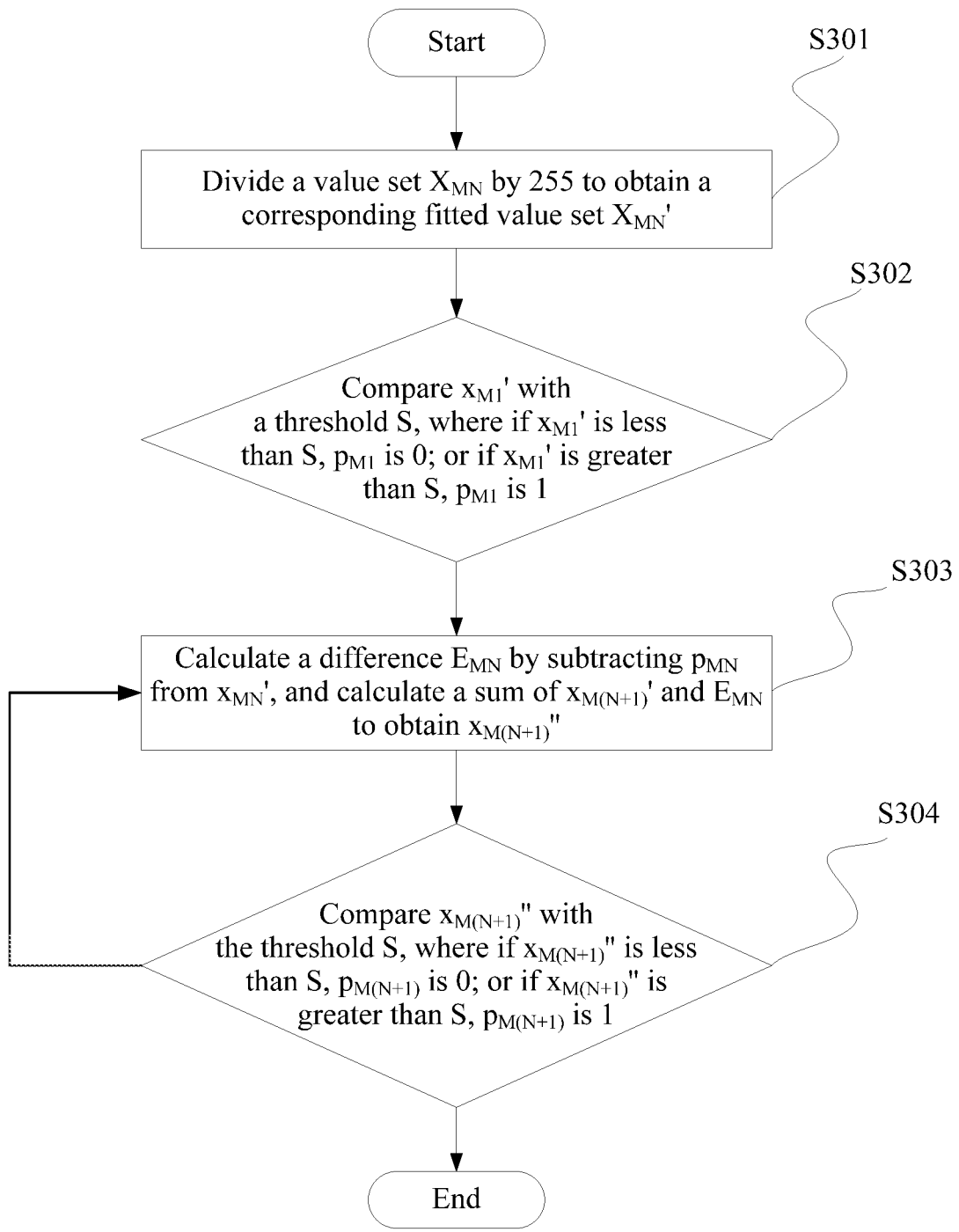
FIG. 3 is a flowchart of a method for obtaining printing data $P_{MN}$ by converting layered image data $D_M$ according to an embodiment of the present invention.

In a third embodiment of the present invention, as shown in FIG. 3, the printing data $P_{MN}$ is obtained in the following manner:

Step S301 is performed. The value set $X_{MN}$ is divided by 255 to obtain a corresponding fitted value set $X_{MN}'$. The fitted value set $X_{MN}'$ sequentially consists of $x_{M1}'$, $x_{M2}'$, $x_{M3}'$, . . . , and $x_{MN}'$ according to an order of neighboring relationships of N pixel points of an $M^{th}$-layer image. Specifically, a person skilled in the art understands that the neighboring relationships are further neighboring relationships of N pixel points that are on a same section layer. For example, a fitted value set $X_{1N}'$ of a first-layer image consists of $x_{11}'$, $x_{12}'$, $x_{13}'$, . . . , and $x_{1N}'$, a fitted value set $X_{2N}'$ of a second-layer image consists of $x_{21}'$, $x_{22}'$, $x_{23}'$, . . . , and $x_{2N}'$, and so on.

Further, step S302 is performed. A threshold S is compared with $x_{M1}'$. If $x_{M1}'$ is less than S, $p_{M1}$ is 0; or if $x_{M1}'$ is greater than S, $p_{M1}$ is 1. A person skilled in the art understands that step S302 is a basic step of this embodiment, and may also be referred to as a start step, and the following steps are performed based on step S302. During actual application, a position of the fitted value $x_{M1}'$ corresponding to step S302 may be randomly generated, or may be specified, and a position of a pixel point corresponding to the fitted value $x_{M1}'$ is used as a center, provided that the fitted value $x_{M1}'$ is generated. Processing is performed on a neighboring pixel point that is not processed. That is, processing is sequentially performed on fitted values of corresponding pixel points according to the order. Specifically, once a position of a pixel point corresponding to the fitted value $x_{M1}'$ is generated, positions of pixel points corresponding to subsequent fitted values are not randomly generated, and are generated according to a sequence and based on the neighboring relationship. Finally, a pixel point sequence is formed, and a fitted valve sequence corresponding to the pixel point sequence is $x_{M2}'$, $x_{M3}'$, . . . , and $x_{MN}'$. For example, after the position of the pixel point corresponding to $x_{M1}'$ is generated, positions of pixel points are sequentially generated rightward and downward.

Further, step S303 is performed. A difference $E_{MN}$ is calculated by subtracting $p_{MN}$ from $x_{MN}'$, and a sum of $x_{M(N+1)}'$ and $E_{MN}$ is calculated to obtain $x_{M(N+1)}''$. A person skilled in the art understands that step S303 is actually an error processing process. This is a difference between this embodiment and the second embodiment. An objective of step S303 is that, the half-tone conversion process is error-prone, and by means of the error processing, the color fidelity of the converted printing data $P_{MN}$ may be high. Specifically, this step is performed based on step S302, and the difference $E_{MN}$ spreads according to a sequence order of the pixel points in step S302. That is, an error of an adjacent point is accepted starting from $x_{M2}'$. For example, the difference $E_{M1}$ is obtained by subtracting $p_{M1}$ from $x_{M1}'$, and a method for accepting an error of $x_{M1}'$ by $x_{M2}'$ is adding $x_{M2}'$ to $E_{M1}$ to obtain $x_{M2}''$, and using $x_{M2}''$ as a processed object. Similarly, $x_{M3}'$, $x_{M4}'$, . . . , and $x_{MN}'$ are sequentially caused to accept errors of neighboring fitted values.

Further, step S304 is performed. $x_{M(N+1)}''$ is compared with the threshold S. If $x_{M(N+1)}''$ is less than S, $p_{M(N+1)}$ is 0; or if $x_{M(N+1)}''$ is greater than S, $p_{M(N+1)}$ is 1. Specifically, as show in FIG. 3, step S303 and step S304 are circularly performed. The number of cycles is determined according to a value of N until $x_{MN}'$ is all converted into $p_{MN}$. That is, $x_{11}'$ is converted into $p_{11}$, $x_{12}'$ is converted into $p_{12}$, $x_{21}'$ is converted into $p_{21}$, $x_{22}'$ is converted into $p_{22}$, . . . , until $x_{MN}'$ is converted into $p_{MN}$. The printing data $P_{MN}$ that is correspondingly formed consists of a series of $p_{MN}$.

Figure 4:
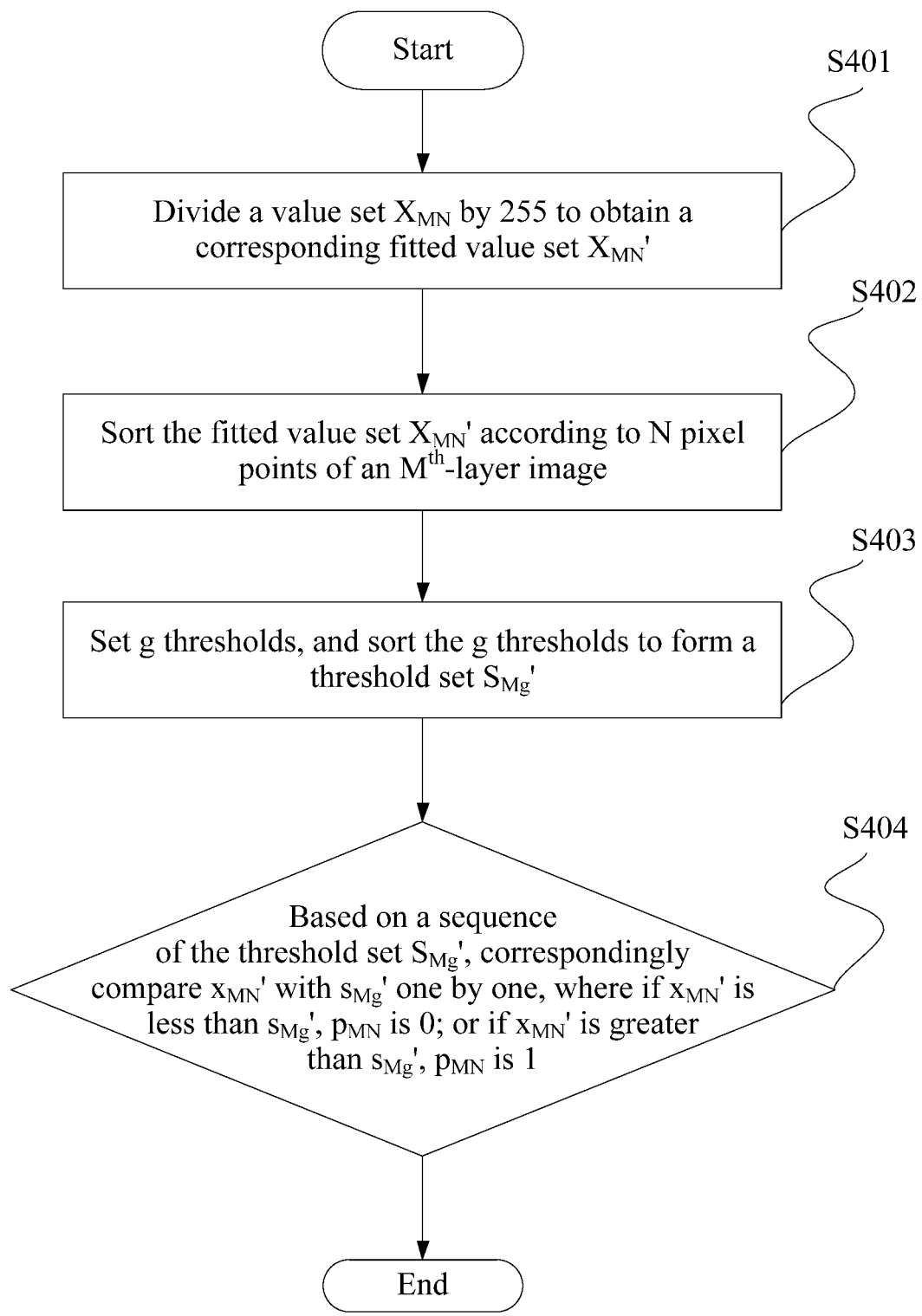
FIG. 4 is a flowchart of a method for obtaining printing data $P_{MN}$ by converting layered image data $D_M$ according to an embodiment of the present invention.

In a fourth embodiment of the present invention, as shown in FIG. 4, the printing data $P_{MN}$ is obtained in the following manner:

Step S401 is performed. The value set $X_{MN}$ is divided by 255 to obtain a corresponding fitted value set $X_{MN}'$. The fitted value set $X_{MN}'$ consists of a series of $x_{MN}'$.

Further, step S402 is performed. The fitted value set $X_{MN}'$ is sorted according to N pixel points of an $M^{th}$-layer image, and the fitted value set $X_{MN}'$ sequentially consists of $x_{M1}'$, $x_{M2}'$, $x_{M3}'$, $x_{M4}'$, . . . , and $x_{MN}'$. Specifically, a person skilled in the art understands that the sorting manner is further based on N pixel points that are on a same section layer. For example, after the sorting, a fitted value set $X_{1N}'$ of a first-layer image consists of $x_{11}'$, $x_{12}'$, $x_{13}'$, . . . , and $x_{1N}'$, a fitted value set $X_{2N}'$ of a second-layer image consists of $x_{21}'$, $x_{22}'$, $x_{23}'$, . . . , and $x_{2N}'$, and so on. Specifically, on each section layer, the sorting may be performed based on a pixel point set of a single unit, or the sorting may be performed based on a pixel point set of multiple units. A specific sorting manner is changeable, may be random sorting, or may be sequential sorting.

Further, step S403 is performed. g thresholds are set and sorted, to form a threshold set $S_{Mg}'$. A person skilled in the art understands that the threshold set $S_{Mg}'$ is set to make comparison with the fitted value set $X_{MN}'$. The threshold set $S_{Mg}'$ includes the g thresholds. That is, the threshold set $S_{Mg}'$ sequentially consists of $s_{M1}'$, $s_{M2}'$, $s_{M3}'$, $s_{M4}'$, . . . , and $s_{Mg}'$. Specifically, g represents the number of the thresholds included in the threshold set $S_{Mg}'$. A value of g may be equal to the number N of the pixel points in step S402, or may be less than the number N of the pixel points in step S402.

Step S404 is performed. Based on a sequence of the threshold set $S_{Mg}'$, N values $x_{MN}$ of the $M^{th}$-layer image in the fitted value set $X_{MN}'$ are correspondingly compared with the g thresholds in the threshold set $S_{Mg}'$ one by one. If $x_{MN}'$ is less than $s_{Mg}'$, $p_{MN}$ is 0; or if $x_{MN}'$ is greater than $s_{Mg}'$, $p_{MN}$ is 1, and the printing data $P_{MN}$ that is correspondingly formed consists of a series of $p_{MN}$. Specifically, this step is also an error processing process. This is a difference between this embodiment and the second embodiment. That is, the fitted value set $X_{MN}'$ is not compared only with a fixed threshold S, but is compared with the threshold set $S_{Mg}'$. In this way, the diversity of the comparison can be implemented, and errors are manually reduced by setting the threshold set $S_{Mg}'$. An objective of step S404 is the same as that of the third embodiment, and details are not described herein again. According to the description of step S403, when g is equal to N, according to a sequence of the threshold set $S_{Mg}'$, that is, according to an order of $s_{M1}'$, $s_{M2}'$, $s_{M3}'$, $s_{M4}'$, ..., and $s_{Mg}'$, comparison is sequentially made with corresponding $x_{M1}'$, $x_{M2}'$, $x_{M3}'$, $x_{M4}'$, ..., and $x_{MN}'$ one by one, to obtain a value of $p_{MN}$. When g is less than N, the comparison is still made one by one according to the sequence of the threshold set $S_{Mg}'$. A difference is that, because g is less than N, the N values of the $M^{th}$-layer image in the fitted value set $X_{MN}'$ cannot be all compared in one comparison process. In this case, cyclic comparison needs to be performed based on the sequence of the threshold set $S_{Mg}'$, that is, multiple comparison processes are included. Specifically, first, a first comparison process is completed, and $s_{M1}'$, $s_{M2}'$, $s_{M3}'$, $s_{M4}'$, ..., and $s_{Mg}'$ are compared with $x_{M1}'$, $x_{M2}'$, $x_{M3}'$, $x_{M4}'$, ..., and $x_{Mg}'$; if $2*g<N$, a second comparison process is started, and $s_{M1}'$, $s_{M2}'$, $s_{M3}'$, $s_{M4}'$, ..., and $s_{Mg}'$ are compared with $x_{M(g+1)}'$, $x_{M(g+2)}'$, $x_{M(g+3)}'$, $x_{M(g+4)}'$, ..., and $x_{MN}$; and if $2*g>N$, a third comparison process is continued, and $s_{M1}'$, $s_{M2}'$, $s_{M3}'$, $s_{M4}'$, ..., and $x_{Mg}'$ are compared with $x_{M(g+1)}'$, $x_{M(g+2)}'$, $x_{M(g+3)}'$, $x_{M(g+4)}'$ ... $x_{M(2*g)}$; then a fourth comparison process is performed, to compare the remaining fitted value $x_{MN}'$ one by one in a similar manner. A person skilled in the art understands that N may be greater than several times of g. Therefore, during actual application, a fifth comparison process, a sixth comparison process, and the like may also be included. The comparison manner is similar, and details are not described herein again. More specifically, further, a value range of the threshold set $S_{Mg}'$ is any value between 0.4 and 0.65.

Further, in the third embodiment and the fourth embodiment, the layered image data $D_M$ may alternatively be 16-bit data, and a value of $X_N$ corresponding to $D_M$ is between 0 and 65535. A specific implementation process is similar to that of the third embodiment and the fourth embodiment, and details are not described herein again.

Figure 5:
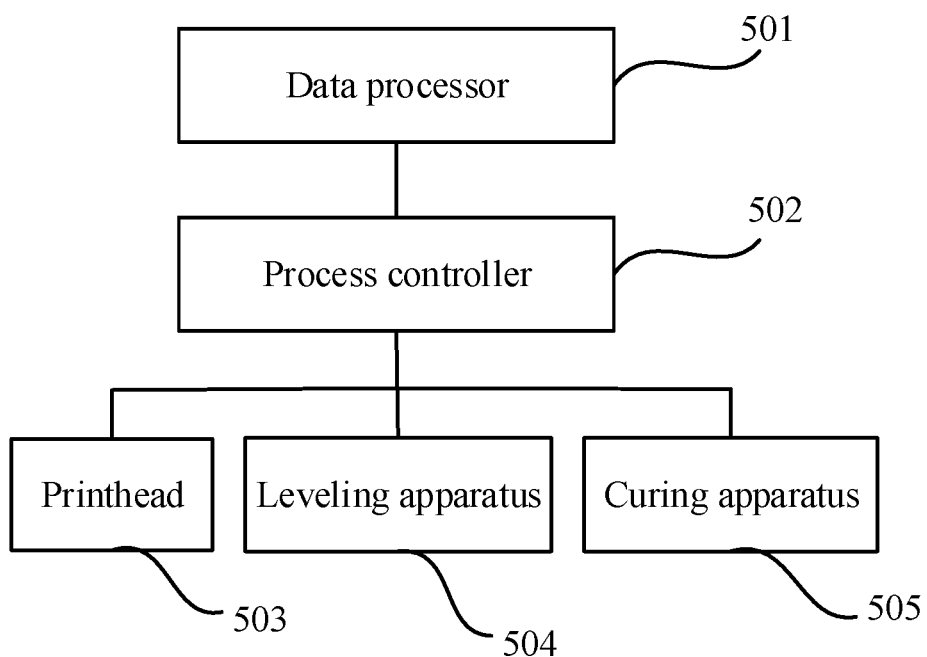
FIG. 5 is a structural diagram of a system for printing a 3D object.

According to another aspect of the present invention, a system for printing a 3D object is provided, including a data processor 501, a process controller 502, and a printhead 503, as shown in FIG. 5. The data processor converts layered image data $D_M$ of a target object to obtain printing data $P_{MN}$, and performs correction on data being 0 in the printing data $P_{MN}$ to obtain corrected printing data $P_{MN}'$. $D_M$ consists of a value set $X_{MN}$ of $N_M$ pixel points. A person skilled in the art understands that the data processor usually includes a central processing unit, a main memory, and an input/output interface. The data processor is configured to process data, and is a part that executes an instruction according to a step specified in a procedure. A common operating process is that, the central processing unit reads the layered image data $D_M$ from the main memory by using the input interface, converts the layered image data $D_M$ according to a particular procedure, obtains the printing data $P_{MN}$ and the corrected printing data $P_{MN}'$ after the conversion, and outputs the printing data $P_{MN}$ and the corrected printing data $P_{MN}'$ by using the output interface.

Further, the process controller usually includes a central processing unit, a main memory, and an input/output interface. The processor controller is configured to convert particular data into an executable operating instruction, stores the executable operating instruction in the main memory, reads the operating instruction during running to form a control signal, and allocates the signal to each part for execution. A common operating process is that, the central processing unit receives the printing data $P_{MN}$ and the corrected printing data $P_{MN}'$, by using the input interface, generates a particular printing instruction according to the printing data $P_{MN}$ and the corrected printing data $P_{MN}'$, and stores the instruction in the main memory. A printing instruction for performing printing by using a first printing material is generated according to the corrected printing data $P_{MN}'$, and a printing instruction for performing printing by using a second printing material is generated according to the printing data $P_{MN}$. Finally, the central processing unit converts the printing instruction into a control signal, and outputs the signal to the printhead by using the output interface. The printhead performs layer-by-layer printing according to the control signal, to form a 3D object by means of superposition. In another variation, the process controller directly outputs the generated printing instruction to the printhead by using the output interface, instead of converting the printing instruction into a control signal. In this case, the printhead matches the received printing instruction with a built-in instruction of the printhead. If the matching succeeds, the printhead performs printing; or if the matching fails, the printhead does not perform printing.

In a preferable embodiment, the system further includes a leveling apparatus 504 and a curing apparatus 505. The leveling apparatus is configured to perform leveling on each result of the layer-by-layer printing. Further, the leveling apparatus includes a transmission apparatus and a function apparatus. The function apparatus may be a leveling roller or a squeegee, and the transmission apparatus may be a mechanical arm. The curing apparatus is configured to perform curing on each result of the layer-by-layer printing. Because the first printing material is different from the second printing material, the curing apparatus may be a thermal curing apparatus, or may be a light-curing apparatus.

The foregoing describes the specific embodiments of the present invention. It should be understood that, the present invention is not limited to the foregoing particular implementations, and a person skilled in the art may make various variations or modifications within the scope of the claims. This cannot affect essential content of the present invention.

What is claimed is:

1. A method for printing a 3D object, comprising the following steps:
   a. performing conversion based on layered image data $D_M$ of a target object to obtain printing data $P_{MN}$, wherein $D_M$ consists of a value set $X_{MN}$ of $N_M$ pixel points, M represents the number of layers of a layered image, and N represents the number of pixel points;
   b. performing layer-by-layer printing based on the printing data $P_{MN}$, wherein when the printing data $P_{MN}$ is 0, a first printing material is used for printing, and when the printing data $P_{MN}$ is 1, a second printing material is used for printing; and
   c. superposing results of the layer-by-layer printing in step b to form a 3D object, wherein:
      in step b, when the printing data $P_{MN}$ is 0, correction is performed on the printing data $P_{MN}$ to obtain corrected printing data $P_{MN}'$, and when the corrected printing data $P_{MN}'$ is identified, the first printing material is used for printing,
      in step b, an association is established between the corrected printing data $P_{MN}'$ and a printing startup instruction, and when the corrected printing data $P_{MN}'$ is identified, the first printing material is used for printing, lamination and unit-division processing is performed on the entire target object to obtain the layered image data $D_M$, in step a, half-tone conversion is performed on the layered image data $D_M$ to obtain the printing data $P_{MN}$, the layered image data $D_M$ is 8-bit data, and values of $X_{MN}$ corresponding to $D_M$ are between 0 and 255, and the printing data $P_{MN}$ is obtained in the following manner:
- a1. dividing the value set $X_{MN}$ by 255 to obtain a corresponding fitted value set $X_{MN}'$, wherein the fitted value set $X_{MN}'$ is between 0 and 1, and the fitted value set $X_{MN}'$ consists of $x_{11}'$, $x_{12}'$, $x_{21}'$, $x_{22}'$, ..., and $x_{MN}'$, and
- a2. setting a threshold S, and comparing the fitted value set $X_{MN}'$ with the threshold S, wherein if $x_{MN}'$ is less than S, converted $p_{MN}$ is 0; or if $x_{MN}'$ is greater than S, converted $p_{MN}$ is 1, and the printing data $P_{MN}$ that is correspondingly formed consists of a series of $p_{MN}$.

2. The printing method according to claim 1, wherein S is any one of the following values: 0.4; 0.5; 0.55; 0.6; or 0.65.

3. The printing method according to claim 1, wherein the layered image data $D_M$ is 16-bit data, and values of the value set $X_{MN}$ corresponding to $D_M$ are between 0 and 65535.

4. The printing method according to claim 1, wherein the first printing material is one of the following materials:
- a transparent material;
- a white material; or
- an off-white material.

5. The printing method according to claim 4, wherein the second printing material is one of the following materials:
- a combination of a cyan material, a magenta material, and a yellow material; or
- a combination of any two of a cyan material, a magenta material, and a yellow material.

6. The printing method according to claim 5, wherein the first printing material and the second printing material are one of the following materials:
- a light-curing material; or
- a temperature curing material.

7. The printing method according to claim 1, wherein in step c, each result of the layer-by-layer printing is cured and then superposed.

8. The printing method according to claim 7, wherein in step c, after being leveled, each result of the layer-by-layer printing is first cured and then superposed.

9. A method for printing a 3D object, comprising the following steps:
- a. performing conversion based on layered image data $D_M$ of a target object to obtain printing data $P_{MN}$, wherein $D_M$ consists of a value set $X_{MN}$ of $N_M$ pixel points, M represents the number of layers of a layered image, and N represents the number of pixel points;
- b. performing layer-by-layer printing based on the printing data $P_{MN}$, wherein when the printing data $P_{MN}$ is 0, a first printing material is used for printing, and when the printing data $P_{MN}$ is 1, a second printing material is used for printing; and
- c. superposing results of the layer-by-layer printing in step b to form a 3D object, wherein:

in step b, when the printing data $P_{MN}$ is 0, correction is performed on the printing data $P_{MN}$ to obtain corrected printing data $P_{MN}'$, and when the corrected printing data $P_{MN}'$ is identified, the first printing material is used for printing, in step b, an association is established between the corrected printing data $P_{MN}'$ and a printing startup instruction, and when the corrected printing data $P^{MN_1}$ is identified, the first printing material is used for printing, lamination and unit-division processing is performed on the entire target object to obtain the layered image data $D_M$, in step a, half-tone conversion is performed on the layered image data $D_M$ to obtain the printing data $P_{MN}$, the layered image data $D_M$ is 8-bit data, and values of $X_{MN}$ corresponding to $D_M$ are between 0 and 255, and the printing data $P_{MN}$ is obtained in the following manner:
- a1'. dividing the value set $X_{MN}$ by 255 to obtain a corresponding fitted value set $X_{MN}'$, wherein the fitted value set $X_{MN}'$ sequentially consists of $x_{M1}'$, $x_{M2}'$, $x_{M3}'$, ..., and $x_{MN}'$ according to an order of neighboring relationships of N pixel points of an $M^{th}$-layer image;
- a2'. comparing a threshold S with $x_{M1}'$, wherein if $x_{M1}'$ is less than S, $p_{m1}$ is 0; or if $x_{M1}'$ is greater than S, $p_{M1}$ is 1;
- a3'. calculating a difference $E_{MN}$ by subtracting $p_{MN}$ from $x_{MN}'$, and calculating a sum of $x_{M(N+1)}'$ and $E_{MN}$ to obtain $x_{M(N+1)}''$;
- a4'. comparing $x_{M(N+1)}''$ with the threshold S, wherein if $x_{M(N+1)}''$ is less than S, $p_{M(N+1)}$ is 0; or if $x_{M(N+1)}''$ is greater than S, $p_{M(N+1)}$ is 1; and
- a5'. repeating steps a3' and a4' until all $x_{MN}'$ are converted into $p_{MN}$, wherein the printing data $P_{MN}$ that is correspondingly formed consists of a series of $p_{MN}$.

10. The printing method according to claim 9, wherein S is any one of the following values: 0.4; 0.5; 0.55; 0.6; or 0.65.

11. The printing method according to claim 9, wherein the layered image data $D_M$ is 16-bit data, and values of the value set $X_{MN}$ corresponding to $D_M$ are between 0 and 65535.

12. The printing method according to claim 9, wherein the first printing material is one of the following materials:
- a transparent material;
- a white material; or
- an off-white material.

13. The printing method according to claim 12, wherein the second printing material is one of the following materials:
- a combination of a cyan material, a magenta material, and a yellow material; or
- a combination of any two of a cyan material, a magenta material, and a yellow material.

14. The printing method according to claim 13, wherein the first printing material and the second printing material are one of the following materials:
- a light-curing material; or
- a temperature curing material.

15. The printing method according to claim 9, wherein in step c, each result of the layer-by-layer printing is cured and then superposed.

16. The printing method according to claim 15, wherein in step c, after being leveled, each result of the layer-by-layer printing is first cured and then superposed.

17. A method for printing a 3D object, comprising the following steps:
- a. performing conversion based on layered image data $D_M$ of a target object to obtain printing data $P_{MN}$, wherein $D_M$ consists of a value set $X_{MN}$ of $N_M$ pixel points, M represents the number of layers of a layered image, and N represents the number of pixel points;
- b. performing layer-by-layer printing based on the printing data $P_{MN}$, wherein when the printing data $P_{MN}$ is 0, a first printing material is used for printing, and when the printing data $P_{MN}$ is 1, a second printing material is used for printing; and
- c. superposing results of the layer-by-layer printing in step b to form a 3D object, wherein:
  - in step b, when the printing data $P_{MN}$ is 0, correction is performed on the printing data $P_{MN}$ to obtain corrected printing data $P_{MN}'$, and when the corrected printing data $P_{MN}'$ is identified, the first printing material is used for printing,
  - in step b, an association is established between the corrected printing data $P_{MN}'$ and a printing startup instruction, and when the corrected printing data $P_{MN}'$ is identified, the first printing material is used for printing,
  - lamination and unit-division processing is performed on the entire target object to obtain the layered image data $D_M$,
  - in step a, half-tone conversion is performed on the layered image data $D_M$ to obtain the printing data $P_{MN}$,
  - the layered image data $D_M$ is 8-bit data, and values of $X_{MN}$ corresponding to $D_M$ are between 0 and 255, and
  - the printing data $P_{MN}$ is obtained in the following manner:
    - a1". dividing the value set $X_{MN}$ by 255 to obtain a corresponding fitted value set $X_{MN}'$, and sorting the fitted value set $X_{MN}'$ according to N pixel points of an $M^{th}$-layer image, wherein the fitted value set $X_{MN}'$ sequentially consists of $x_{M1}'$, $x_{M2}'$, $x_{M3}'$, $x_{M4}'$, ..., and $x_{MN}'$;
    - a2". setting g thresholds and sorting the g thresholds to form a threshold set $S_{Mg}'$, wherein the threshold set $S_{Mg}'$ sequentially consists of $s_{M1}'$, $s_{M2}'$, $s_{M3}'$, $s_{M4}'$, ..., and $s_{Mg}'$, and $0 < g \leq N$; and
    - a3". based on a sequence of the threshold set $S_{Mg}'$, correspondingly comparing N values $x_{MN}'$ of the $M^{th}$-layer image in the fitted value set $X_{MN}'$ with the g thresholds $s_{Mg}'$ in the threshold set $S_{Mg}'$ one by one, wherein if $x_{MN}'$ is less than $s_{Mg}'$, $p_{MN}$ is 0; or if $x_{MN}'$ is greater than $s_{Mg}'$, $p_{MN}$ is 1, and the printing data $P_{MN}$ that is correspondingly formed consists of a series of $p_{MN}$.

18. The printing method according to claim 17, wherein a value range of the threshold set $S_{Mg}'$ is any value between 0.4 and 0.65.

19. The printing method according to claim 17, wherein the layered image data $D_M$ is 16-bit data, and values of the value set $X_{MN}$ corresponding to $D_M$ are between 0 and 65535.

20. The printing method according to claim 17, wherein the first printing material is one of the following materials:
- a transparent material;
- a white material; or
- an off-white material.

21. The printing method according to claim 20, wherein the second printing material is one of the following materials:
- a combination of a cyan material, a magenta material, and a yellow material; or
- a combination of any two of a cyan material, a magenta material, and a yellow material.

* * * * *